United States Patent [19]
Eytcheson et al.

[11] Patent Number: 6,054,765
[45] Date of Patent: Apr. 25, 2000

[54] PARALLEL DUAL SWITCH MODULE

[75] Inventors: Charles Tyler Eytcheson; Monty Bradford Hayes, both of Kokomo; Lisa Ann Viduya, Carmel; Roger Allen Mock, Kokomo; Eric Von Kierstead, Anderson; Todd G. Nakanishi; Robert John Campbell, both of Noblesville; Erich William Gerbsch, Brownsburg, all of Ind.

[73] Assignee: Delco Electronics Corporation, Kokomo, Ind.

[21] Appl. No.: 09/067,242

[22] Filed: Apr. 27, 1998

[51] Int. Cl.⁷ .................................................. H01L 23/34
[52] U.S. Cl. ........................ 257/724; 257/723; 257/693
[58] Field of Search .................................. 257/723, 724, 257/690, 692, 693, 698, 705, 727, 678, 787, 107

[56] References Cited

U.S. PATENT DOCUMENTS

| | | |
|---|---|---|
| 5,444,295 | 8/1995 | Lake et al. ............................... 257/678 |
| 5,492,842 | 2/1996 | Eytcheson et al. ......................... 437/7 |
| 5,519,253 | 5/1996 | Lake et al. ............................... 257/724 |
| 5,523,620 | 6/1996 | Eyecheson et al. . |
| 5,539,254 | 7/1996 | Eytcheson et al. . |
| 5,563,447 | 10/1996 | Lake et al. . |
| 5,616,955 | 4/1997 | Yamada et al. . |
| 5,661,343 | 8/1997 | Takahashi et al. . |
| 5,761,040 | 6/1998 | Iwasa et al. . |
| 5,814,884 | 9/1998 | Davis et al. . |
| 5,821,618 | 10/1998 | Graf et al. . |
| 5,895,974 | 4/1999 | Eytcheson et al. . |

FOREIGN PATENT DOCUMENTS 0 427 143 A3  11/1990  European Pat. Off. ........ H01L 25/07

*Primary Examiner*—Sheila V. Clark
*Attorney, Agent, or Firm*—Jimmy L. Funke

[57] ABSTRACT

A parallel dual switch module that is characterized by improved mechanical and electrical packaging efficiency and low cost. The module includes a common terminal defined by a first stamped elongate metal plate insert molded into the module housing, and positive and negative terminals defined by second and third stamped elongate metal plates disposed side-by-side atop the common terminal. Connection areas formed on the positive and negative terminals extend in opposite lateral directions, and interdigitate with connection areas formed on the common terminal, thereby forming two linear parallel rows of connection areas. Adjacent each row of connection areas, and mounted on a baseplate of the module is a set of parallel connected transistors subassemblies. A molded elongate gate collection component is mounted on the baseplate between the sets of transistor subassemblies, and beneath the common terminal. The gate collection component confines a pair of insert molded gate terminal strips to which the gate terminals of the respective sets of transistor subassemblies are connected, and the terminal strips, in turn, are coupled to gate terminals of the module. The transistor subassemblies are mounted in close proximity to the central terminal structure, and the metal tabs of the subassemblies are shaped to prevent interference with the overlying terminal connection areas, and to provide stress relief.

14 Claims, 14 Drawing Sheets

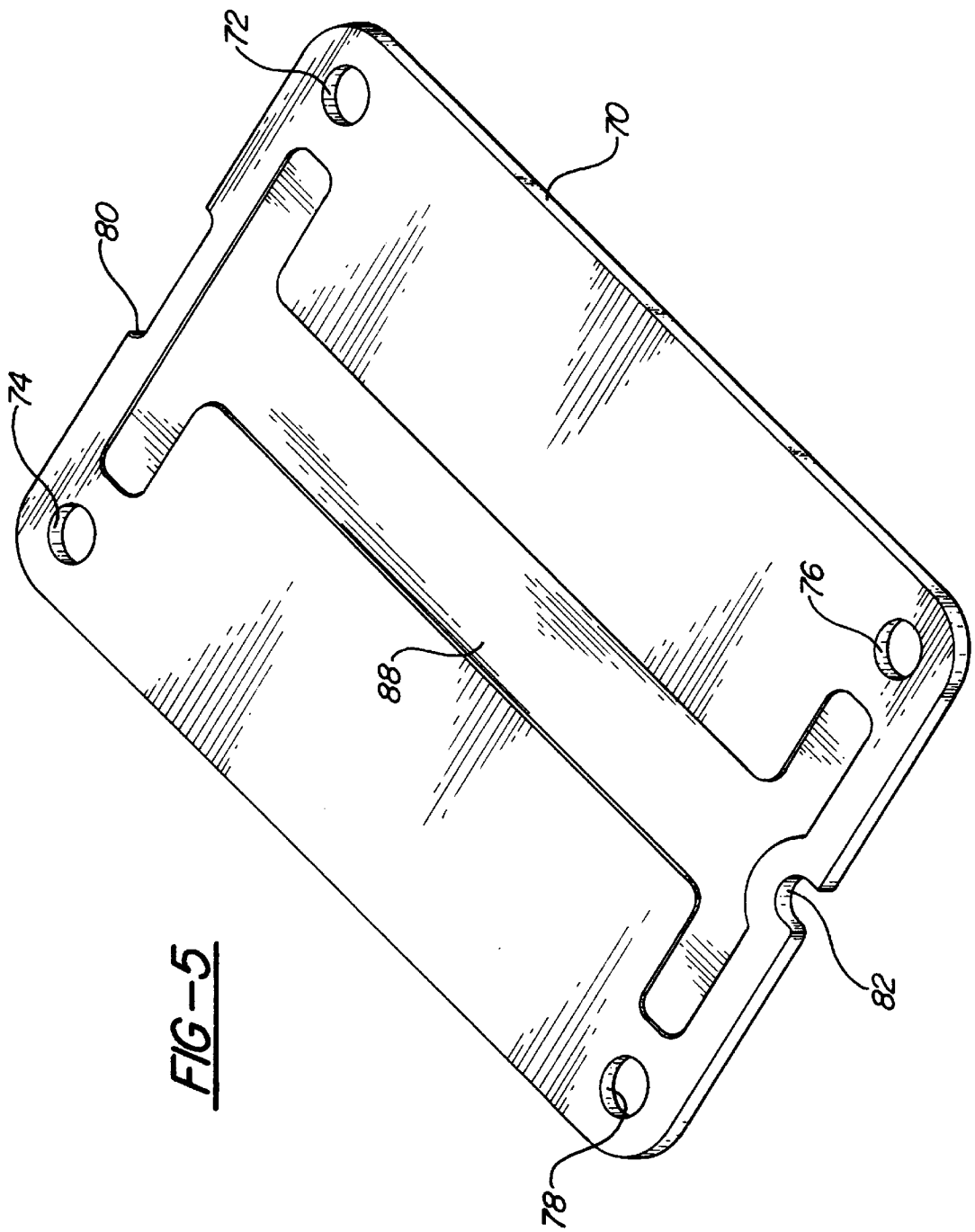

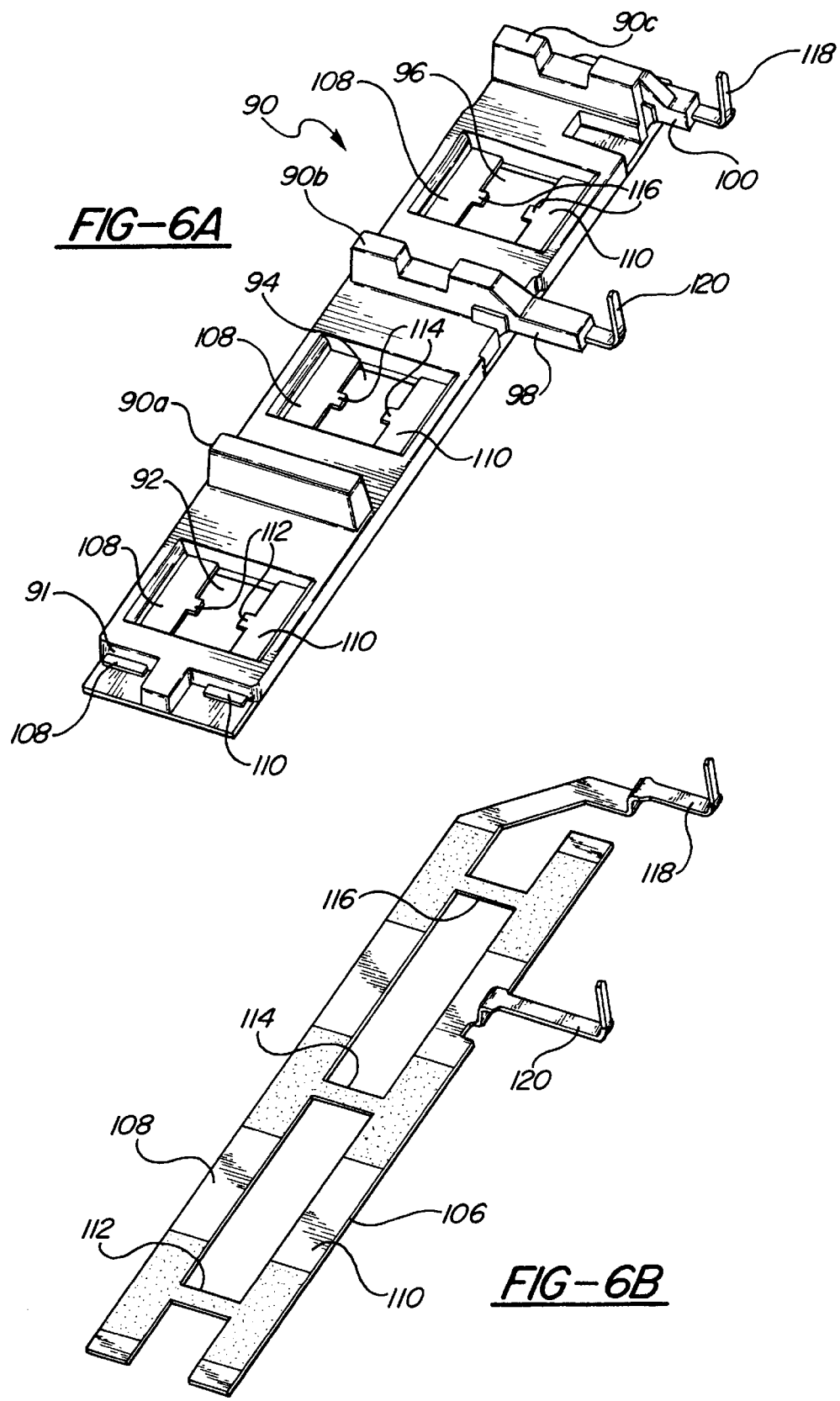

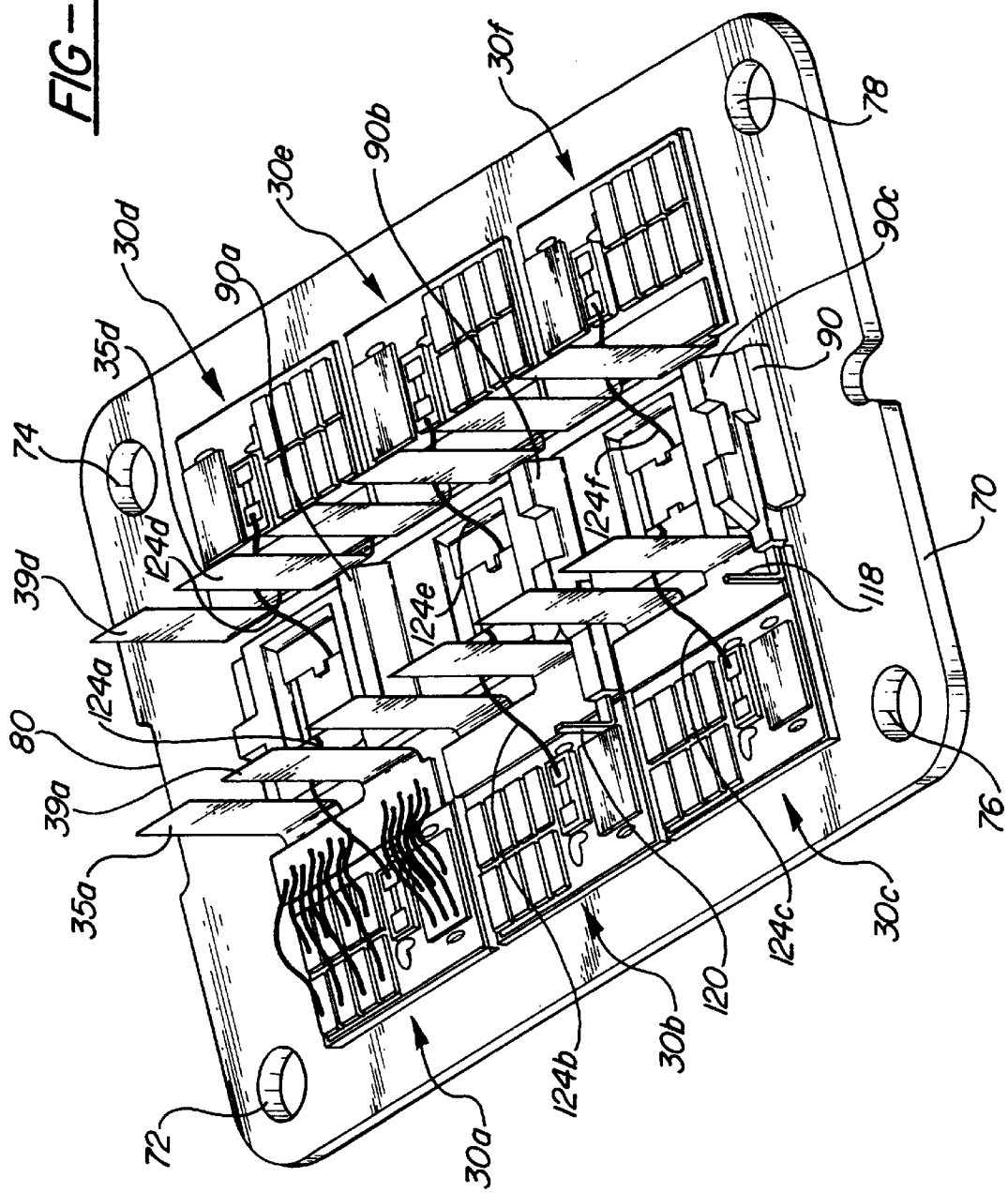

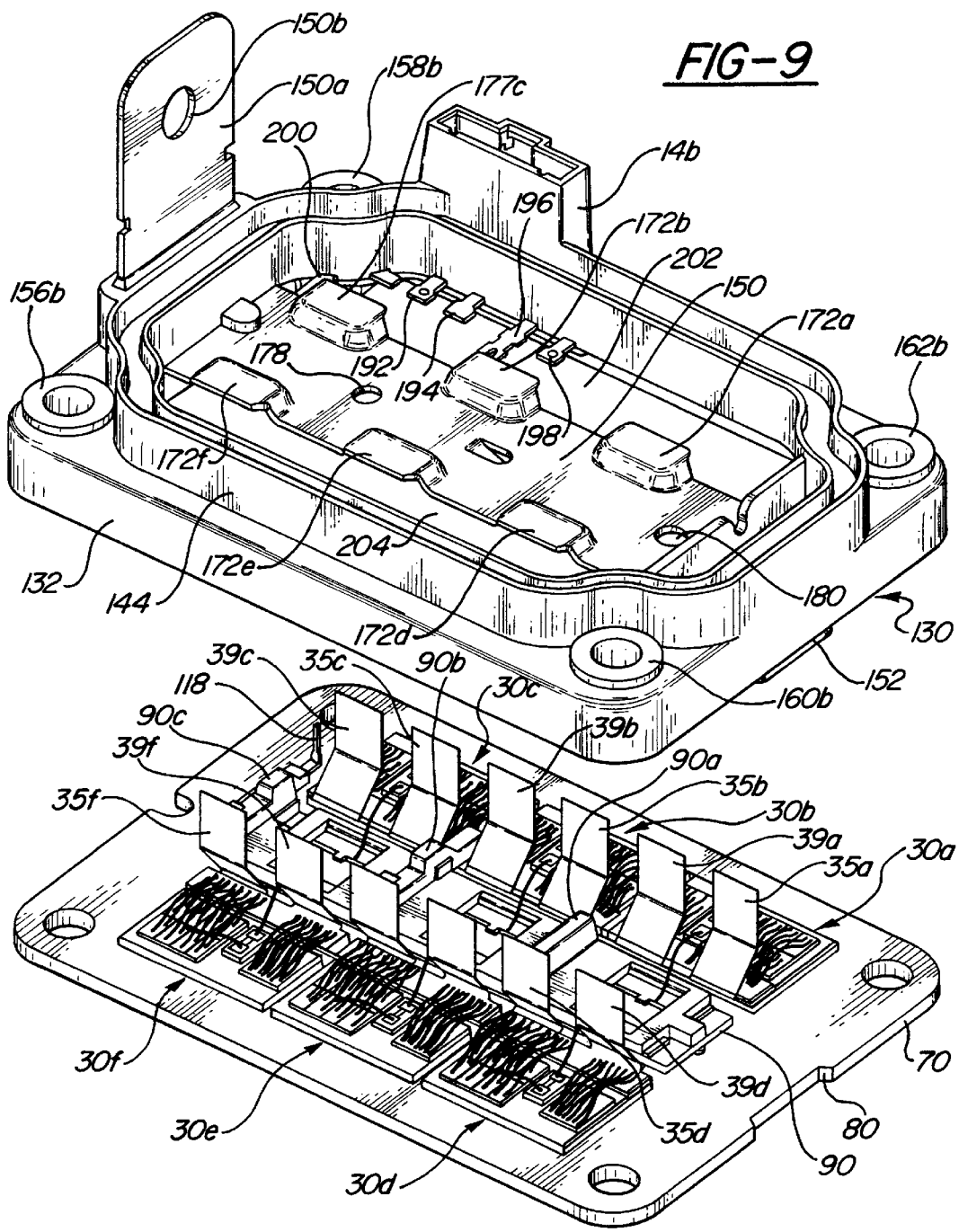

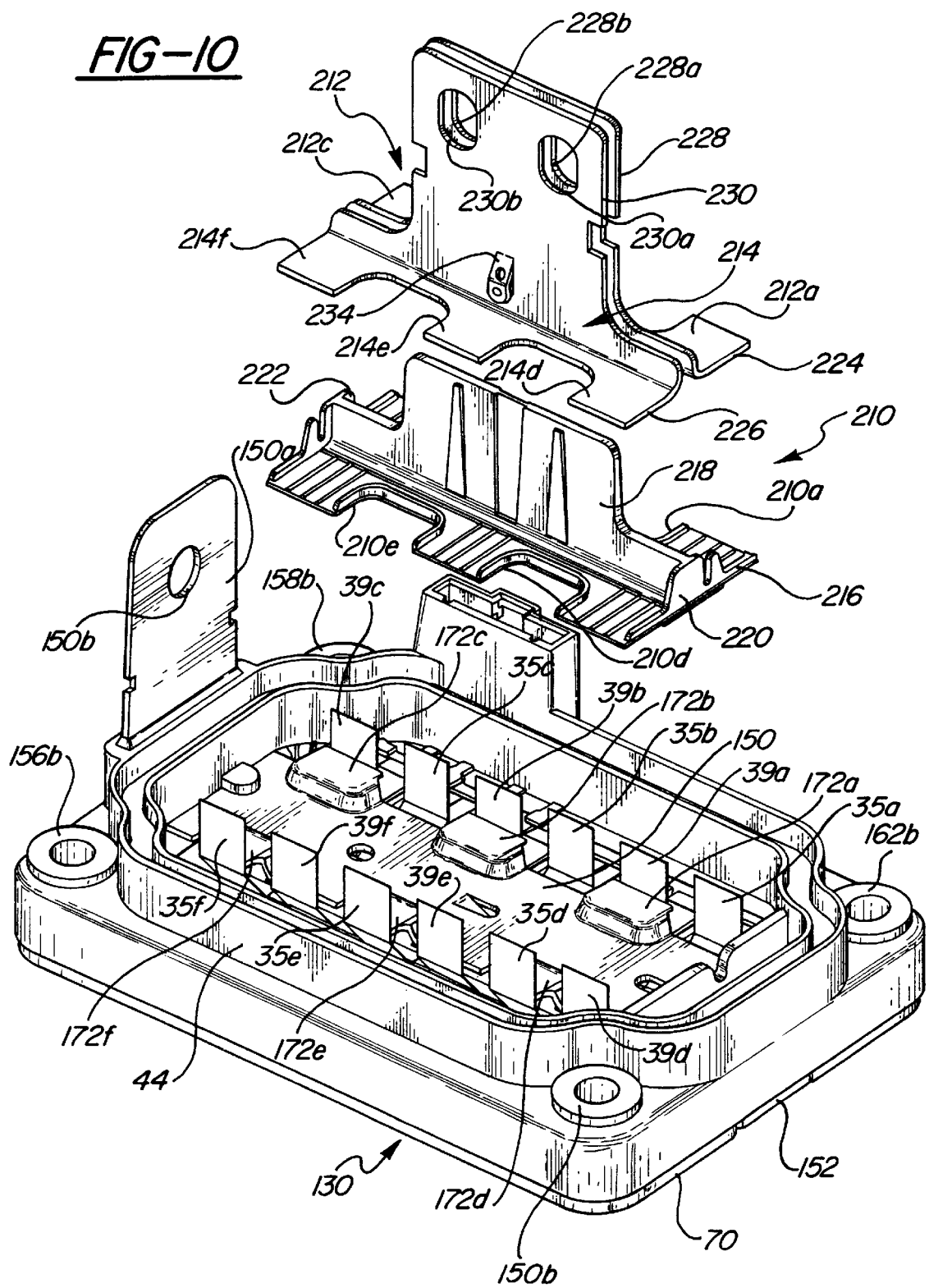

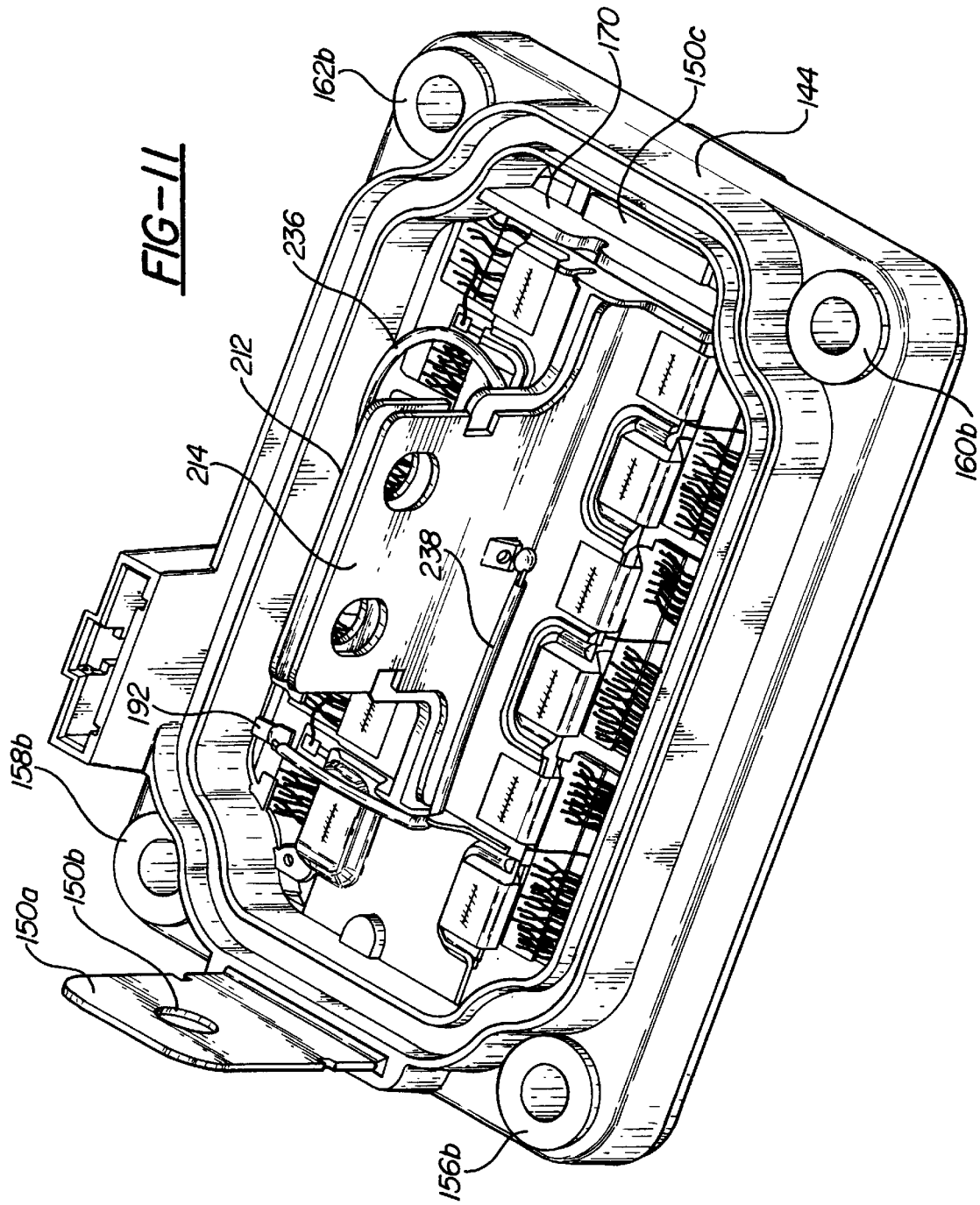

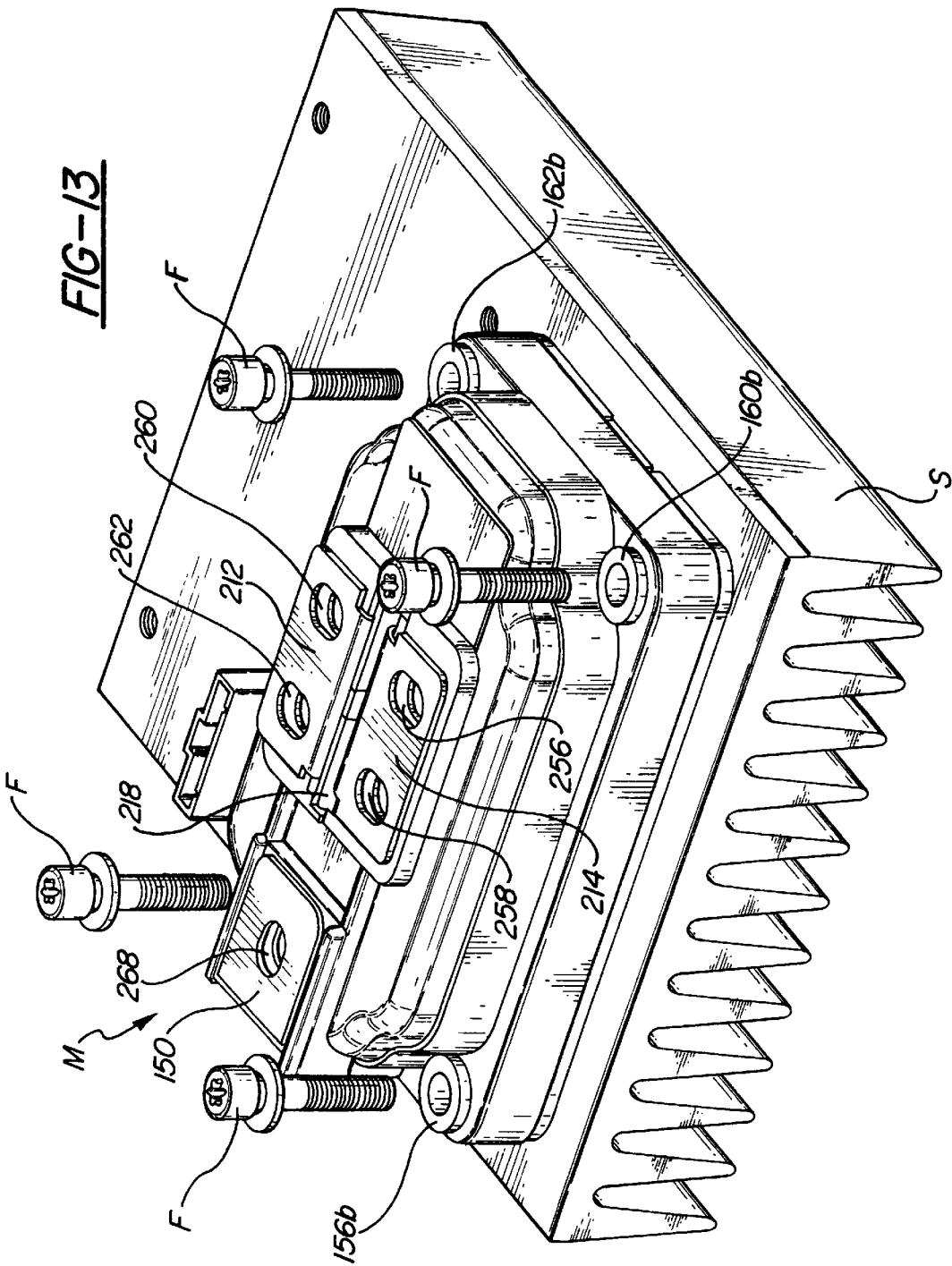

PARALLEL DUAL SWITCH MODULE

This invention relates to high power semiconductor switch modules, and more particularly to a compact and highly efficient packaging arrangement for a dual switch module.

BACKGROUND OF THE INVENTION

High power electric motor and other control applications commonly utilize semiconductor bridge circuits for converting DC power to AC power, or vice versa. In an electric or hybrid vehicle, for example, a bridge circuit may be operated to power one or more AC drive motors from a DC storage battery, or alternately, to charge the DC storage battery from an AC source.

To simplify physical packaging of the bridge circuit, a pair of complementary bridge switches may be conveniently incorporated into a single module, sometimes referred to a dual switch module. In such a package, there are three current carrying terminals: a positive terminal, a negative terminal and a common terminal to which both bridge switches are connected.

An example of a dual switch module is shown in the U.S. Pat. No. 5,523,620 to Eytcheson et al., issued on Jun. 4, 1996, assigned to the assignee of the present invention, and incorporated herein by reference. In that module, a set of three current carrying terminals are arranged in linear fashion on a baseplate of the module, and the two complementary switches are formed by two sets of transistor subassemblies disposed on the baseplate on either side of the linearly arranged terminals. The terminals have integral frame portions that at least partially overlap to define two parallel rows of interdigitated connection areas, and each transistor subassembly is coupled to a pair of adjacent connection areas via metal foil tabs coupled to its respective transistor. The gate terminals of the various transistors are bonded to exposed tabs of a pair of metal lead frames insert molded into a housing of the module, and a pair of gate terminals provide electrical access to the lead frames. Due to the linear symmetry, this type of package is sometimes referred to as a parallel dual switch module.

SUMMARY OF THE PRESENT INVENTION

The present invention is directed to a parallel dual switch module characterized by improved mechanical and electrical packaging efficiency and lower cost, compared with previously known configurations. Numerous packaging and layout features contribute to reduced inductance, and hence improved high frequency switching performance.

According to the present invention, the common terminal of the module is defined by a first stamped elongate metal plate insert molded into the module housing, and the positive and negative terminals are defined by second and third stamped elongate metal plates disposed side-by-side atop the common terminal. Connection areas formed on the positive and negative terminals extend in opposite lateral directions, and interdigitate with connection areas formed on the common terminal, thereby forming two linear parallel rows of connection areas. Adjacent each row of connection areas, and mounted on a baseplate of the module is a set of parallel connected transistors subassemblies. Advantageously, a molded elongate gate collection component is mounted on the baseplate between the sets of transistor subassemblies, and beneath the common terminal. The gate collection component confines a pair of insert molded gate terminal strips to which the gate terminals of the respective sets of transistor subassemblies are connected, and the terminal strips, in turn, are coupled to gate terminals of the module. The centrally disposed gate collection component serves to more fully utilize the space in the terminal area of the module, and at the same time, provides a rigid insulative support for the elongate common terminal. Additionally, mounting the insulative gate collection component on the baseplate adjacent the transistor subassemblies permits a very close spacing of the transistor subassemblies relative to a longitudinal axis of the module, as the metal tabs of the subassembly may be shaped to prevent interference with the overlying terminal connection areas.

BRIEF DESCRIPTION OF THE DRAWINGS

FIG. 5 is a bottom view of the baseplate depicted in FIG. 4.

FIGS. 6A–6C depict a gate collection component according to this invention. FIG. 6A is a top isometric view of the gate collection component; FIG. 6B is an isometric view of a metal lead frame insert molded in the gate collection component; and FIG. 6C is a bottom isometric view of the gate collection component.

FIG. 7 is an isometric view of the baseplate of FIG. 4, with the transistor subassemblies and the gate collection component mounted thereon.

FIG. 8A is a partially exploded isometric top view of the housing; FIG. 8B is a partially exploded isometric bottom view of the housing; and FIG. 8C is an isometric view of a metal lead frame insert molded in the housing.

FIG. 9 is a exploded isometric view of the housing, baseplate, and transistor subassemblies of FIGS. 7 and 8.

FIG. 10 is an exploded isometric view of the assembly of FIG. 9, positive and negative terminal plates, and a terminal plate insulator, according to this invention.

FIG. 11 is an isometric view of the assembly of FIG. 10, with the transistor subassemblies electrically bonded to the positive, negative and common terminal plates.

FIG. 13 is an isometric view of a completed parallel dual switch module according to this invention.

DETAILED DESCRIPTION OF THE DRAWINGS

Figure 1:
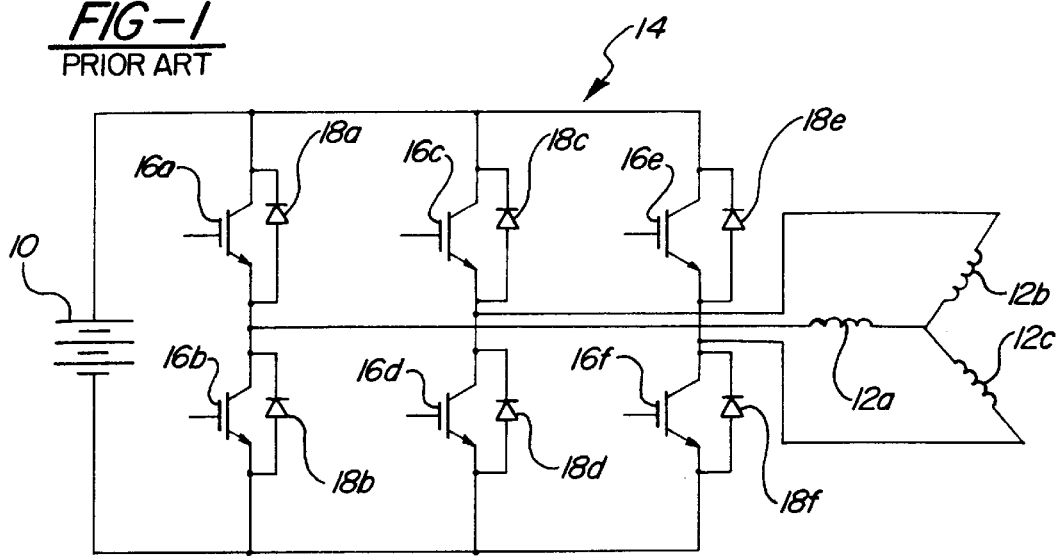
FIG. 1 is a prior art circuit diagram of a transistor bridge circuit as used in an electric vehicle.

The circuit diagram of FIG. 1 shows in general an intended environment for the parallel dual switch of this invention. The battery 10 represents the storage battery pack of an electric vehicle, and the windings 12a–12c represent the windings of a three-phase AC traction motor of the vehicle. A full wave bridge circuit 14 coupling the battery 10 and motor windings 12a–12c comprises six semiconductor switching devices 16a–16f. The switching devices 16a–16f are considered for purposes of this disclosure to be insulated gate bi-polar transistors (IGBTs), although other types of switching devices could be used instead. In each case, a free-wheeling diode 18a–18f is connected in shunt with the respective emitter-collector circuit to provide a current path for circulating currents when the respective IGBT is non-conductive. For example, transistors 16a and 16d might be biased conductive to deliver battery current to motor windings 12a and 12b, resulting in a circulating current through free-wheeling diodes 18b and 18c when the transistors 16a and 16d are subsequently rendered non-conductive.

Figure 2:
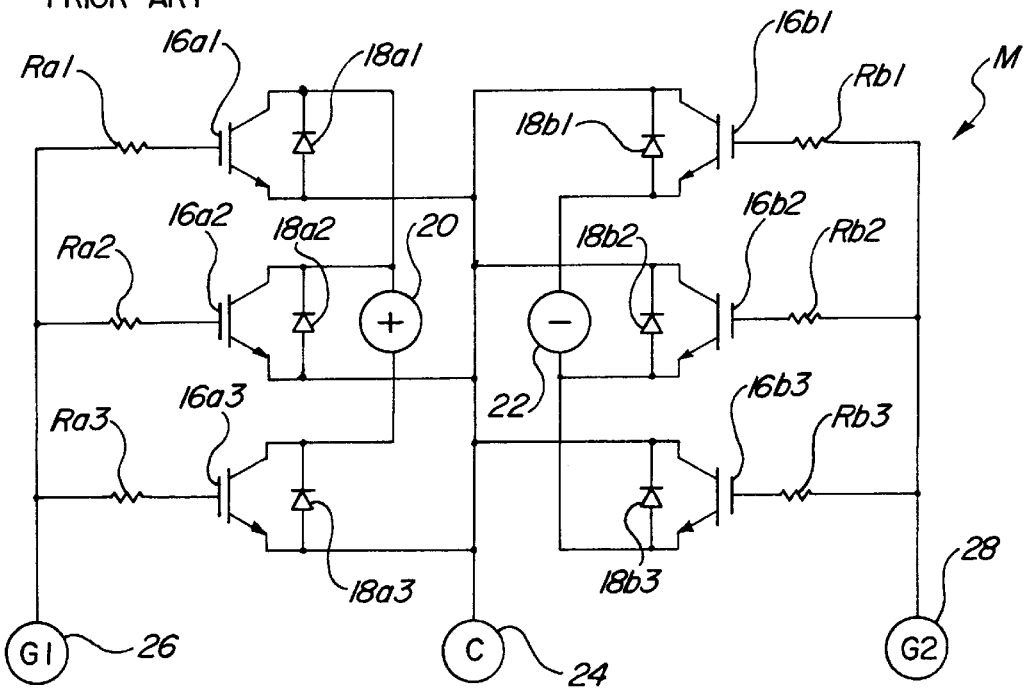
FIG. 2 is a prior art circuit diagram a pair of complementary bridge transistors, as connected in a dual switch module.

The bridge 14 may be considered as consisting of three pairs of electrically coupled complementary transistors: a first pair 16a–16b, a second pair 16c–16d, and a third pair 16e–16f. Complementary pairs of transistors may be conveniently packaged together in a single module M with three power terminals (positive battery, negative battery, and common) and two gate terminals. Separate gate terminals for the upper and lower transistors of the module must be provided, as the transistors are independently controlled and never biased conductive at the same time. To increase current handling capability, each of the upper and lower transistors may actually comprise several transistors connected in parallel. Such an arrangement of complementary transistors is depicted in the circuit diagram of FIG. 2, where each of the bridge transistors, say 16a and 16b, comprises three parallel connected transistors and free-wheeling diodes, designated as 16a1–16a3; 16b1–16b3; 18a1–18a3; and 18b1–18b3. The collectors of the upper transistors 16a1, 16a2 and 16a3 are coupled to the positive (+) terminal 20 of the module, and the emitters of the lower transistors 16b1, 16b2, 16b3 are coupled to the negative (−) terminal 22 of the module. The emitters of the upper transistors 16a1, 16a2 and 16a3 and the collectors of the lower transistors 16b1, 16b2, 16b3 are both coupled to the common (C) terminal 24 of the module. The gates of the upper transistors 16a1, 16a2 and 16a3 are connected to a first (G1) gate terminal 26 of the module through input resistors Ra1, Ra2, Ra3, and the gates of the lower transistors 16b1, 16b2, 16b3 are connected to a second (G2) gate terminal 28 of the module through input resistors Rb1, Rb2, Rb3. An emitter Kelvin connection for the upper transistors 16a1, 16a2, 16a3 is designated as EK1, and an emitter Kelvin connection for the lower transistors 16b1, 16b2, 16b3 is designated as EK2.

From the standpoint of packaging, the module may conveniently comprise a central terminal structure, with the upper and lower set of transistors arranged on opposite sides of the terminal structure. In general, this configuration may be referred to as a parallel dual switching module, and an exemplary design exhibiting a high degree of mechanical and electrical symmetry is shown in the aforementioned U.S. Pat. No. 5,523,620. The present invention is directed to an improved parallel dual switching module that exhibits an even greater degree of symmetry, that is more compact, and that is significantly less expensive to manufacture. A preferred embodiment of a parallel dual switching module according to this invention is described below in reference to FIGS. 3–13, which illustrate the assembly of the module in addition to its constituent components.

Figure 3:
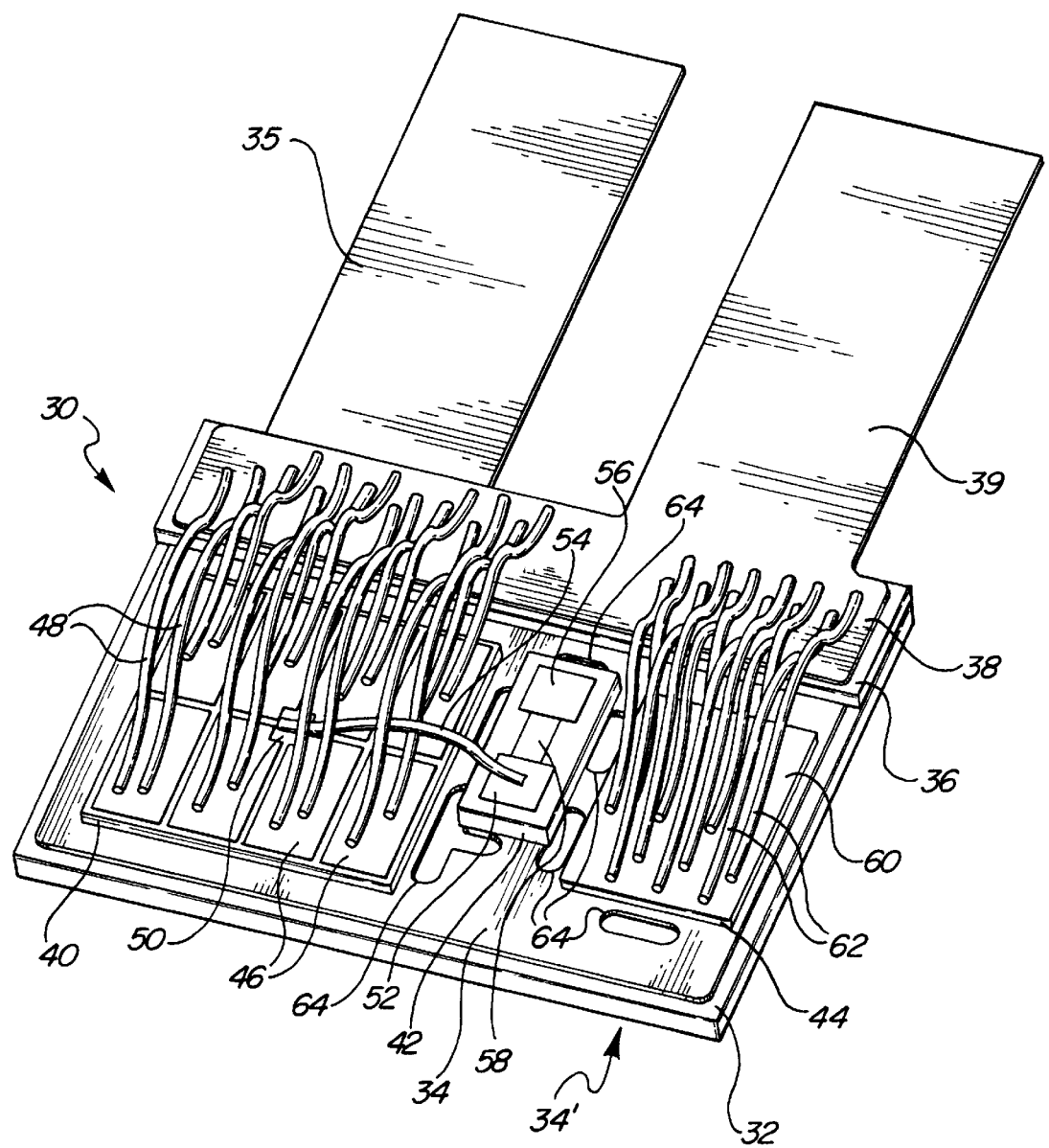
FIG. 3 is an isometric view of a transistor subassembly in accordance with this invention.

FIG. 3 depicts an individual transistor subassembly 30, six of which are installed in a module, as described above. The substrate of each subassembly 30 comprises a beryllium oxide wafer 32, with rectangular copper foil plates 34, 34' bonded to upper and lower faces thereof, by direct copper bonding for example, the lower plate 34' being hidden in the view of FIG. 3. The upper copper plate 34 has an integral, generally rectangular, extension 35 that extends beyond the wafer 32 to form a first connection tab, as described below in reference to FIG. 11. A second beryllium oxide wafer 36 is bonded to a marginal region of copper plate 34 near the extension 35, and another copper foil plate 38 is bonded to the wafer 36. Similar to the copper foil plate 34, the copper foil plate 38 has an integral, generally rectangular, extension 39 that extends beyond the wafers 32 and 36 to form a second connection tab, as described below in reference to FIG. 11.

An IGBT chip 40, a resistor chip 42 and a diode chip 44 are soldered to the exposed surface of the copper foil plate 34. The collector terminal of the IGBT chip 40 faces downward, while the emitter terminal, divided into a series of wirebond sites 46, lies on the exposed surface of the chip 40. The IGBT collector terminal is electrically coupled to the extension 35 by virtue of its being soldered to copper foil plate 34, and the IGBT emitter terminal is electrically coupled to the extension 39 by the wirebond conductors 48, which couple each of the emitter sites 46 to the copper foil plate 38. The IGBT gate terminal 50 also lies on the exposed surface of the chip 40, and is coupled to a first pad 52 on the resistor chip 42 by wirebond conductor 54. The resistor chip 42 comprises a ceramic substrate which may be glued, or metalized and soldered, to copper foil plate 34, a pair of metal wirebond pads 52, 56, and a printed strip resistor 58 interconnecting the pads 52 and 56. The IGBT gate connection is made at pad 56, as described below in reference to FIG. 7 so that the resistor 58 is connected in the IGBT gate circuit. The diode chip 44 has metalized major surfaces defining a downward facing cathode terminal and an exposed anode terminal 60. The cathode terminal is electrically coupled to the extension 35 by virtue of its being soldered to copper foil plate 34, and the anode terminal 60 is electrically coupled to the extension 39 by the wirebond conductors 62. The various openings 64 formed in copper foil plate 34 have been found to be beneficial in locating the chips 42 and 44 during soldering.

Figure 4:
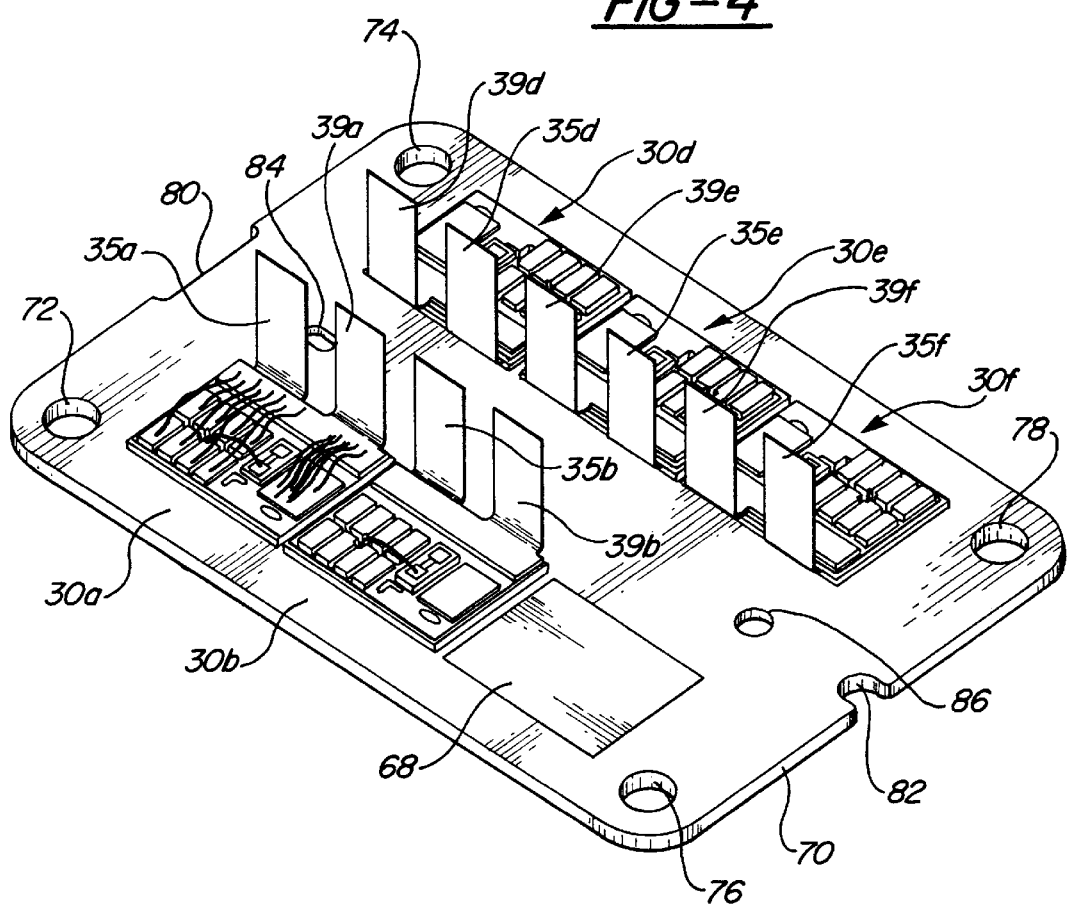
FIG. 4 is an isometric view of a module baseplate with five transistor subassemblies mounted thereon.

FIG. 4 depicts five of the six transistor subassemblies, with the copper foil extensions 35, 39 bent perpendicular to the respective substrates, mounted on a generally rectangular baseplate 70. For reference, the various transistor subassemblies and components are designated by the lower case letters a–f in FIGS. 4, 7, 9, 10 and 11. For clarity, the majority of the wirebond conductors have been omitted in FIGS. 4 and 7.

Baseplate 70 may be formed of any material having good thermal heat transfer properties and a coefficient of thermal expansion that matches or nearly matches that of the transistor subassemblies 30. One material satisfying these criteria is a metal/ceramic composite sold by Lanxide Corporation, Newark, Del., U. S. A., under the designation MCX-736. The subassemblies 30a–30f are soldered to metalized bond sites 68 formed on the baseplate 70, one of which is shown in FIG. 4.

Four corner openings 72–78 are provided for attachment of the module, as explained below in reference to FIGS. 8A–8B. Additionally, cutouts 80 and 82 formed in opposite longitudinal ends of baseplate 70 mate with complementary tabs 152 and 154 formed in the module housing 130 (described below in reference to FIGS. 8A–8B) for ensuring proper alignment of the housing 130 relative to the baseplate 70 during assembly of the module. Similarly, the blind holes 84 and 86 formed in the central region of baseplate 70 mate with complementary tabs 102 and 104 formed in gate collection component 90 (described below in reference to FIGS. 6A–6C) for ensuring proper alignment of the gate collection component 90 relative to the baseplate 70 during assembly.

FIG. 5 depicts the bottom, or exterior, major face of baseplate 70, revealing a recessed region 88 formed in the central region, and along the longitudinal ends of the baseplate 70. As will be more apparent after the description of the module is completed, the area occupied by the recess 88 does not support any significant heat producing components, and does not need to be firmly clamped to the underlying support structure. However, the areas opposite the transistor subassemblies 30*a*–30*f* do need to be clamped firmly to the support structure, and it has been found that the recess helps ensure that firm clamping is consistently achieved in such areas. At the same time, a volume of baseplate material corresponding to recess 88 is saved, and the weight of the module is correspondingly reduced.

Figure 6C:
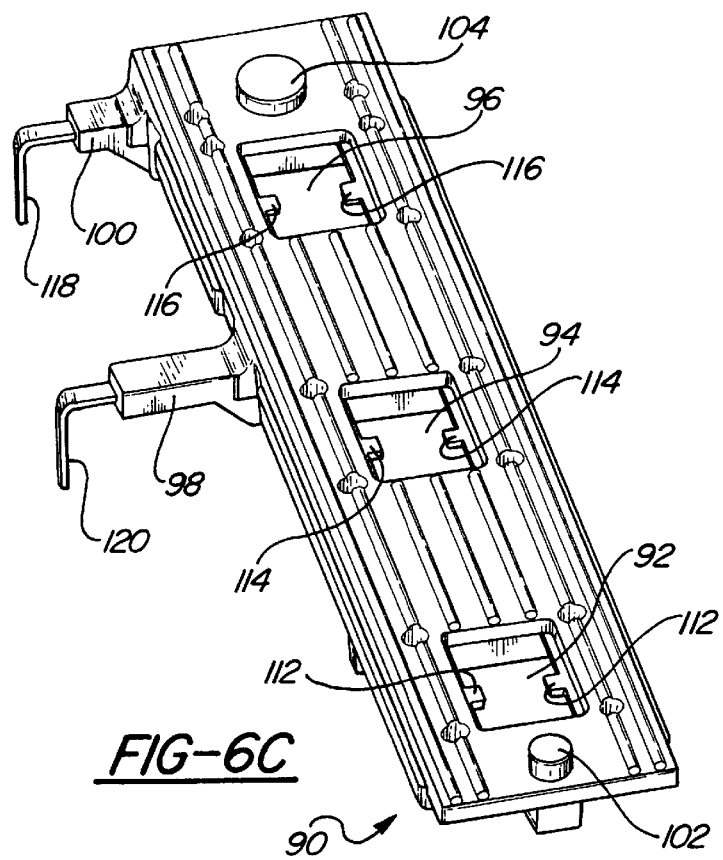

FIGS. 6A–6C depict a molded component referred to herein as gate collection component 90 designed to mount on the central longitudinal face of baseplate 70 between the two parallel rows of transistor subassemblies 30*a*–30*c* and 30*d*–30*f*. The molded plastic portion of the component 90, best seen in FIGS. 6A and 6C, is an elongate strip featuring three windows or apertures 92, 94, 96 and two terminal fingers 98, 100. The lateral ridges 90*a*, 90*b*, 90*c* provide support for the common terminal plate 150 which rests atop component 90, as described below in reference to FIGS. 9–10. The cutouts in ridges 90*b* and 90*c* accommodate a Kelvin conductor 176, described below in reference to FIG. 8B. A pair of differentially sized buttons 102, 104 which protrude from the bottom face of the component 90 mate with the blind openings 84, 86 of baseplate 70, described above in reference to FIG. 4.

A stamped metal lead frame 106, shown in FIG. 6B, comprises a pair of parallel metal strips 108 and 110 joined by the integral metal links 112, 114, 116, a first terminal 118 extending from the strip 108, and a second terminal 120 extending from the strip 110. The shaded areas are aluminum clad to facilitate wire bonding.

The lead frame 106 is insert molded in the component 90 so that exposed aluminum clad areas of metal are supported within the apertures 92–96, and so that the terminals 118 and 120 extend out of the terminal fingers 100 and 98, respectively. After formation of the component 90, central portions of the metal links 112–116 are removed to electrically isolate the strips 108 and 110. The gate collection component 90 is then glued to the baseplate 70 as seen in FIG. 7. The gate terminals of one set of transistor subassemblies 30*a*–30*c* are coupled to the exposed areas of strip 110 in apertures 92–96 by wirebond conductors 124*a*–124*c*, and the gate terminals of the other set of transistor subassemblies 30*d*–30*f* are coupled to the exposed areas of strip 108 by wirebond conductors 124*d*–124*f*. Conveniently, the wirebond conductors 124*a*–124*f* are routed between the respective tabs 35*a*–35*f* and 39*a*–39*f*, as shown. The terminals 118 and 120 extend laterally alongside groups of wirebond conductors.

Figure 8C:
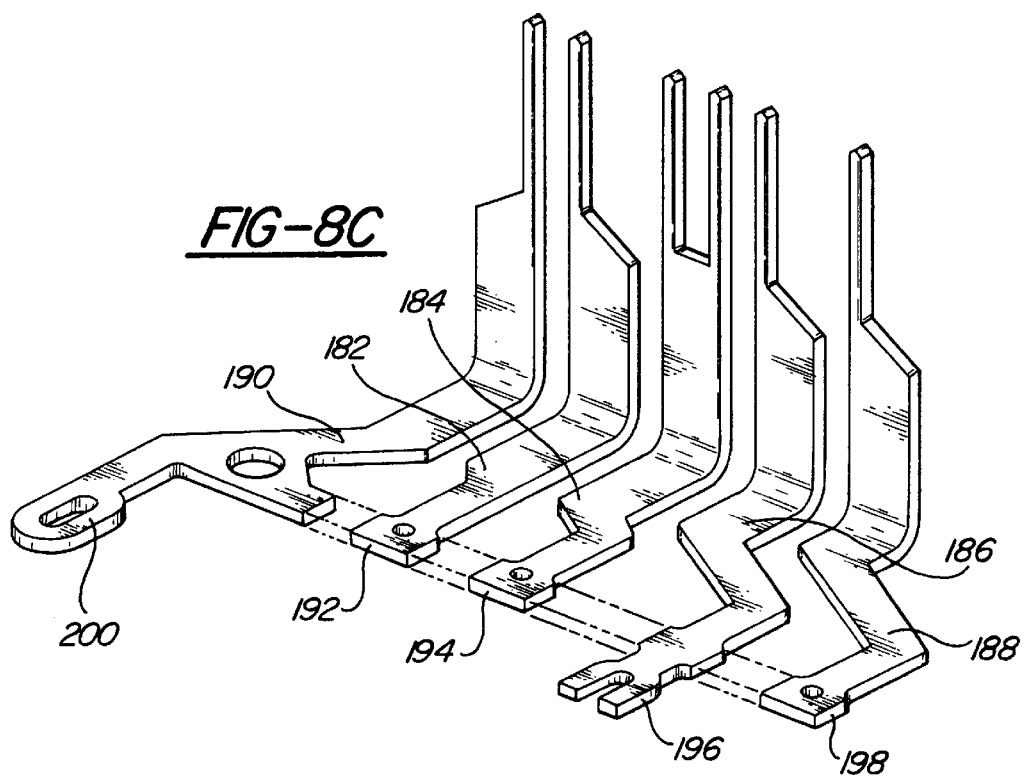
FIGS. 8A–8C depict a module housing according to this invention.
Figure 8A:
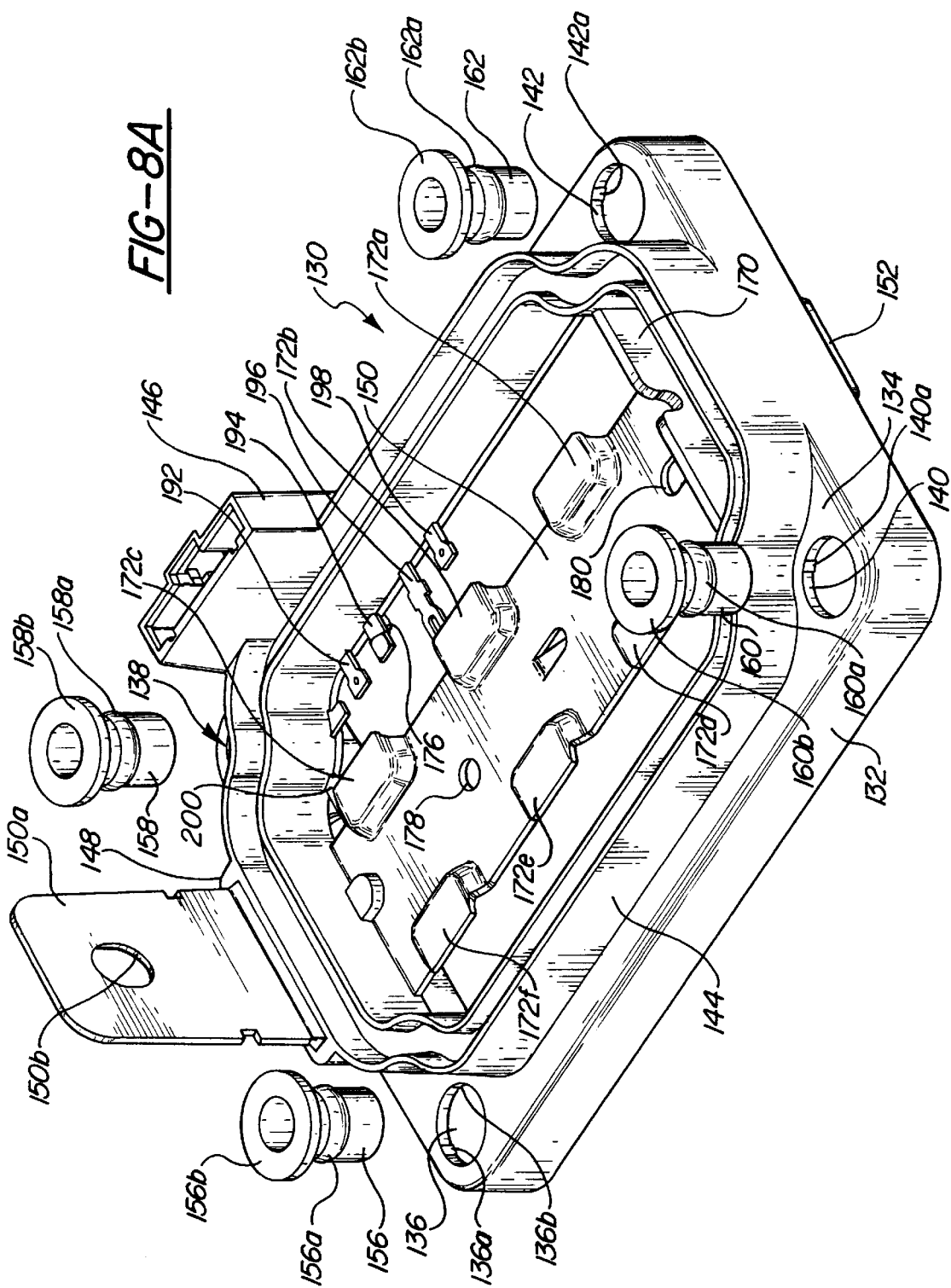
Figure 8B:
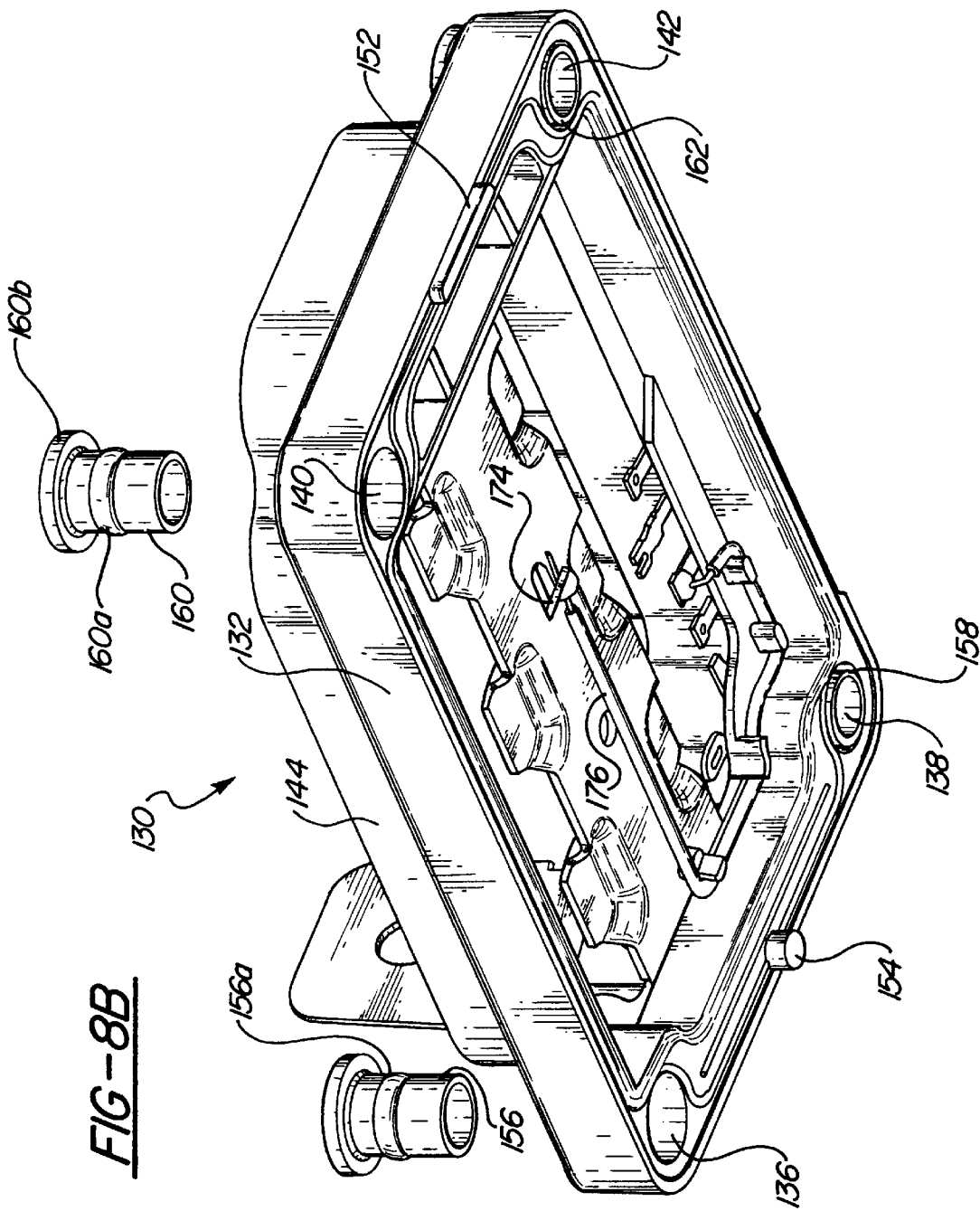

FIGS. 8A–8B depict a molded housing 130 designed to be glued to the margin of baseplate 70 as shown in FIGS. 9 and 10. Housing 130 has lower wall section 132 that provides clearance for the transistor subassemblies 30*a*–30*f* and gate collection component 90, a marginal surface 134 extending inward from the wall section 132 for accommodating corner openings 136–142 corresponding to the baseplate openings 72–78, an upper double wall section 144 for accommodating common terminal plate 150, a gate terminal housing portion 146, and a common terminal housing portion 148. A pair of buttons 152 and 154 protruding from the underside of housing 130 at the longitudinal ends thereof are designed to mate with the complementary cutouts 80 and 82 formed in the ends of baseplate 70.

In each corner of the housing 130, a metal bushing 156–162 is inserted in the respective opening 136–142. The openings 136–142 are formed such that three or so small tabs or bumps 136*a*, 136*b*, 140*a*, 142*a* protrude toward the center of the opening, as seen in FIG. 8A. These bumps interfere with annular ribs 156*a*, 158*a*, 160*a*, 162*a* formed on the outer periphery of bushings 156–162 when the bushings 156–162 are inserted into the openings 136–142. During assembly, the annular ribs 156*a*, 158*a*, 160*a*, 162*a* are pushed past the bumps 136*a*, 136*b*, 140*a*, 142*a* so that the bushings 156–162 are loosely captured within the openings 136–142. In the view of FIG. 8B, the bushings 158 and 162 are shown installed in the openings 138 and 142, respectively. A flange or shoulder 156*b*–162*b* at the top of each bushing 156–162 interferes with the marginal top surface 134 of the housing 130, capturing the bushings within the housing openings 136–142. As seen in FIG. 8B, the length of the bushings 156–162 is such that when installed in housing 130, the ends of the bushings opposite the respective flange 156*b*–162*b* are essentially flush with the bottom surface of the housing 130. Thus, when the housing 130 is secured to the baseplate 70, the bushings 156–162 engage baseplate 70, leaving a small clearance between the flanges 156*b*–162*b* and the top surface 134. When a fastener F (see FIG. 13) is inserted into a respective bushing 156–160 to secure the module M to an underlying support structure S, the head of the fastener F bears down on the respective flange 156*b*–162*b*, and the fastening force developed when the fastener F is threaded into the support structure S is transferred through the respective bushing 156–162 to the baseplate 70 without stressing the housing 130.

The common terminal plate 150 is insert molded in the housing 130. The terminal end 150*a* of plate 150 extends vertically out of the housing 130 at the terminal housing portion 148, and is provided with an opening 150*b* for attachment of a conductor lug, as described below in reference to FIGS. 12 and 13. The remainder of plate 150 extends horizontally along the length of housing 130 in a central region thereof from the base of the double wall 144. As best seen in FIG. 11, the end 150*c* of terminal plate 150 extends through the housing wall 170 into a pocket between the wall 170 and the interior wall of double housing wall 144. This allows some relative movement of the metal terminal plate 150 and plastic housing wall 144 during manufacture of the housing 130 and subsequent thermal cycling of the module, thereby to minimize stress and warping of terminal plate 150.

The terminal plate 150 has six raised spaced apart areas 172*a*–172*f* along its lateral marginal regions which respectively serve as connection sites for the transistor subassembly tabs 39*a*–39*c* and 35*d*–35*f*, as explained below in reference to FIG. 11. Additionally, a tab 174 is formed in a central area of the plate 150, and bent downward as shown to facilitate the attachment of a Kelvin conductor 176, as seen in FIG. 8B. Finally, a pair of openings 178 and 180 are provided for ensuring proper orientation of the central terminal assembly, described below in reference to FIG. 10.

FIG. 8C depicts a set of five metal lead frame elements 182–190 that are insert molded in the housing wall section 144 as shown to facilitate gate and Kelvin connections with the terminal housing portion 146. The housing wall sections have been broken away to reveal the lead frame elements 182–190. After the housing 130 has been molded, the exposed portions of the lead frame within a cavity defined by the wall section 144 are trimmed as indicated by the terminal portions shown in phantom to define a series of five solderable terminals 192–200. As seen in FIG. 8B, the Kelvin conductor 176 is soldered to the underside of terminal 194.

The terminals 196 and 200 are formed to capture the vertical extensions of the gate collection component terminals 120 and 118, respectively. Kelvin connections to terminals 192 and 198 are described below in reference to FIGS. 10–11. The exposed ends 182'–190' of the lead frame elements 182–190 opposite the terminals 192–200 are disposed within the gate terminal housing portion 146, and are adapted to mate with a suitable connector (not shown) for controlling switching of the module M. Significantly, terminal ends 182'–190' are trimmed to provide increased separation between exposed ends carrying disparate voltages. Thus, the low voltage terminal 182', which stays close to battery ground, is separated from the adjacent terminal 184', which varies from battery ground to positive battery voltage. Similarly, the high voltage terminal 188', which stays close to positive battery voltage, is separated from the adjacent terminal 186', which varies substantially from battery ground to positive battery voltage. The increased separation between terminals carrying disparate voltages reduces cross-talk between signals and reduces the likelihood of shorting due to moisture and foreign matter, as the connector may not be environmentally sealed against the housing section 146.

FIG. 9 depicts a completed housing 130 ready for attachment to a completed baseplate assembly 70. Prior to assembly, the tabs 35a–35f and 39a–39f are formed as shown to provide clearance for the common terminal plate 150. During assembly, vertically extending portions of the tabs 35a–35f and 39a–39f extend through elongate openings 202, 204 between the terminal plate 150 and opposing portions of the housing wall section 144.

FIG. 10 depicts a module with the housing 130 attached to the baseplate 70, the central terminal plate 150 resting atop the ridges 90a–90c of gate collection component 90, and a central terminal assembly comprising an insulator 210, a positive terminal plate 212 and a negative terminal plate 214. As may be seen in FIG. 10, the positive and negative terminal plates 212, 214 are identical to reduce the number of different parts. The insulator 210 has a horizontally disposed section 216 which rests atop common terminal plate 150, and has four cutouts to accommodate the raised areas 172a, 172b, 172d and 172e. Insulator 210 also has a central longitudinally extending divider 218, bounded by lateral wall segments 220 and 222. The positive and negative terminal plates 212 and 214 each have horizontal portions 224, 226 that rest atop the horizontal portion 216 of insulator 210, on opposite sides of divider 218. These horizontal portions also have cutouts to accommodate the raised portions 172a, 172b, 172d and 172e of common terminal plate 150. The cutouts define a series of three spaced apart connection areas 212a–212c and 214d–214f that rest atop corresponding portions of insulator 210, and interdigitate with the raised areas 172a–172f of common terminal plate 150. Due to the thickness of the horizontal portion 216 of insulator 210 and the thickness of terminal plates 212 and 214, the exposed upper surfaces of connection areas 212a–212c and 214d–214f lie in substantially the same horizontal plane as the upper surfaces of raised areas 172a–172f; this facilitates single pass laser welding of the tabs 35a–35f and 39a–39f, as shown in FIG. 11. The positive and negative terminal plates 212 and 214 also have vertical portions 228 and 230 with openings 228a–228b and 230a–230b for attachment of electrical cables or bus bars, as described below in reference to FIGS. 12 and 13. Finally, a tab 232 (not shown) and 234 is formed in each of the vertical portions 228, 230, protruding outwardly as shown to facilitate the attachment of Kelvin conductors 236, 238, as seen in FIG. 11. The Kelvin conductor 236 is soldered to the housing terminal 198, and the Kelvin conductor 238 is soldered to the housing terminal 192. Significantly, the Kelvin conductors 236, 238 are symmetrically disposed on the terminal plates 212, 214 to help ensure that parallel connected transistors will be turned on and off substantially in unison.

FIG. 11 shows the module with terminals 212 and 214 installed, and the transistor subassembly tabs 35a–35f and 39a–39f each bent into contact with a respective terminal connection area and laser or electron beam welded in place. It will be seen that the raised areas 172a–172c of terminal plate 150 are aligned opposite the transistor subassembly tabs 39a–39c, respectively, and the raised areas 172d–172f are aligned opposite the transistor subassembly tabs 35d–35f, respectively. Thus, when tabs 39a–39c and 35d–35f are folded down atop the respective raised areas 172a–172f and welded in place as shown, the emitter terminals of the upper transistor subassemblies 30a–30c and the collectors terminals of the lower transistor subassemblies 30d–30f will be electrically coupled to the common terminal plate 150. Similarly, it will be seen that the connection areas 214d–214f of negative terminal plate 214 are aligned opposite the transistor subassembly tabs 39d–39f, respectively, and that although partially obscured in FIG. 11, the connection areas 212a–212c of positive terminal plate 212 are aligned opposite the transistor subassembly tabs 35a–35c, respectively. Thus, when tabs 39d–39f are folded down atop the respective connection areas 214d–214f and welded in place as shown, the emitter terminals of the lower transistor subassemblies 30d–30f are electrically coupled to the negative terminal plate 214. Similarly, when tabs 35a–35c are folded down atop the respective connection areas 212a–212c and welded in place as shown, the collector terminals of the upper transistor subassemblies 30a–30c are electrically coupled to the positive terminal plate 212.

In final form, it will be seen that the tabs 35a–35f and 39a–39f each have a Z-shaped profile. This permits close spacing between the transistor subassemblies 30a–30f and the gate collection component 90 while providing adequate clearance, and thereby contributes to increased space utilization within the module. The Z-bends additionally provide stress relief to accommodate relative movement of the baseplate 70 and terminal plates 150, 212, 214 during thermal cycling of the module. Significantly, however, tabs have a vertical (i.e., perpendicular to substrate 70) portion in the vicinity of wirebond conductors 124a–124f, which couple the transistor gate terminals to the gate collection component 90. This feature effectively eliminates cross-talk between the gate signals and the motor current conducted through the adjacent tabs 35a–35f, 39a–39f, as the magnetic fields associated with the respective signals are mutually perpendicular, and do not magnetically couple.

As best seen in FIG. 11, the terminal assembly comprising common terminal plate 150, positive terminal plate 211 and negative terminal plate 214 is symmetrically configured for low inductance. In general, low inductance is achieved by providing thin, wide terminal plates with adjacent plates carrying currents of opposite direction, wherever possible. This is achieved with positive and negative terminal plates 212 and 214, which are thin and wide, and sit side-by-side atop central terminal plate 150. Further inductance-canceling occurs with respect to currents carried in central terminal plate 150 and the tab portions 212a–212f and 214a–214f of terminal plates 212 and 214. Additionally, the openings 228a, 228b and 230a, 230b are spaced apart to encourage even distribution of current in the terminal plates 212, 214, which also contributes to low inductance. In addition to low inductance, the terminal assembly is configured to provide substantially balanced resistance among the conduction paths for the individual transistors on each side of the terminal assembly. This objective is primarily achieved by having wide terminal plates with even current distribution, as explained above, and helps ensure that the parallel connected transistors will turn on and off substantially in unison to equally share the load current.

The above described inductance and resistance symmetry provides an additional advantage in scaleability. That is, the same module can be used to house a switch with only two or one transistor substrates on each side of the terminal assembly, with no major changes in the module design.

Figure 12:
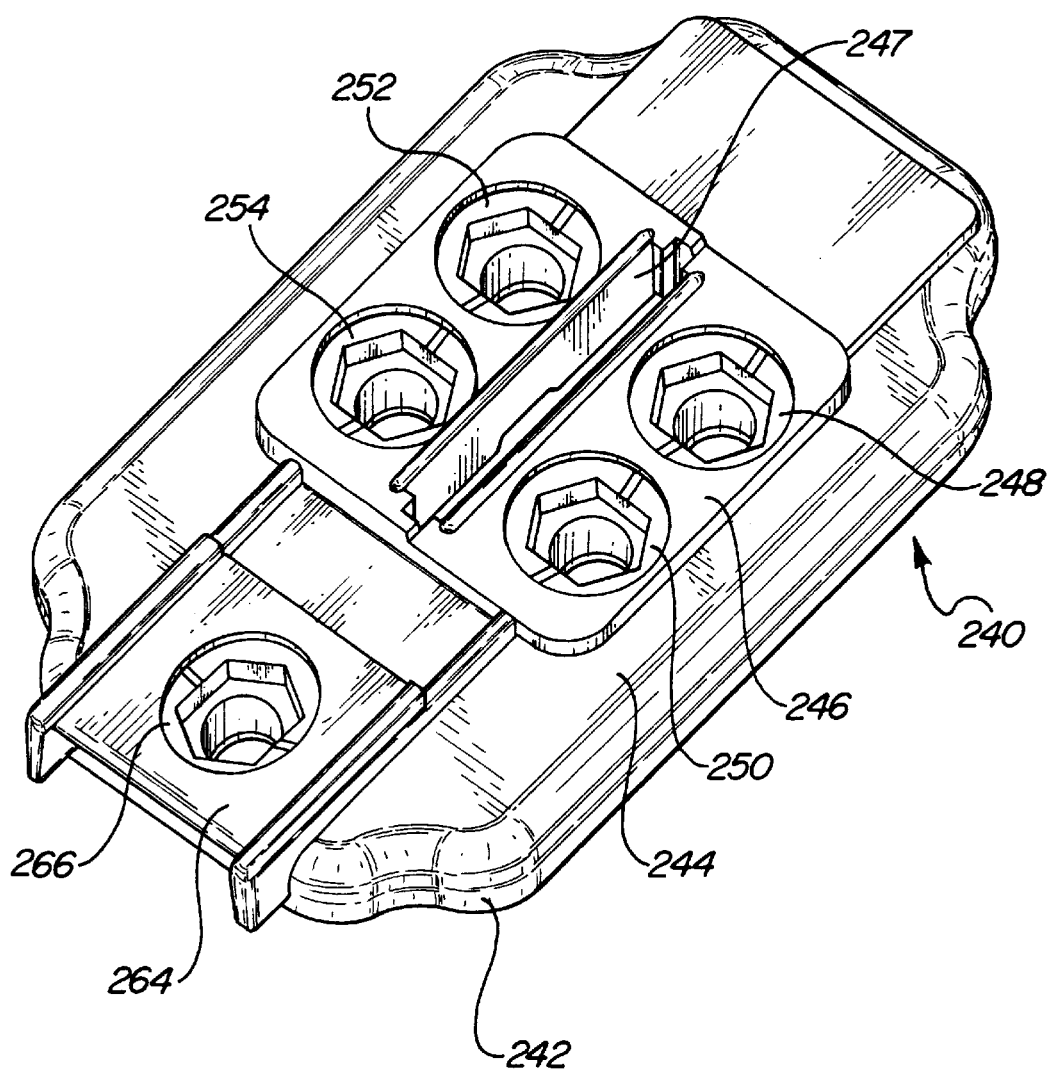
FIG. 12 is an isometric view of a module cover according to this invention.

FIG. 12 shows a molded plastic top cover 240 having vertical side walls 242 that conform to, and are adapted to be glued within, the double wall section 144 of housing 130. The top portion 244 of cover 240 includes a raised central area 246 with an opening 247 for receiving and supporting positive and negative terminal plates 212 and 214, and the divider 218 of insulator 210, as seen in FIG. 13. On opposite sides of the opening 247 are formed pairs of wells 248–254 for receiving hex-shaped metal lugs 256–262 (shown in FIG. 13) and fasteners (not shown) for securing electrical cables or bus bars to the positive and negative terminal plates 212, 214. Another raised area 264 is provided at a longitudinal end of top portion 244 for supporting the common terminal plate 150, as also seen in FIG. 13. A single well 266 is formed in the raised area 264 for receiving a hex-shaped metal lug 268 (shown in FIG. 13) and fastener (not shown) for clamping an electrical cable or bus bar to the common terminal plate 150.

Finally, FIG. 13 depicts a completed parallel dual switching module M according to this invention. As shown, the exposed portions of terminals 150, 212, 214 are flattened against the respective raised areas 246, 264 of top cover 240. So positioned, the terminals 150, 212, 214 are essentially co-planar, and the positive and negative terminals 212, 214 are closely spaced for convenient attachment of multiple modules to a low-inductance sandwiched bus bar structure.

In summary, the parallel dual switching module of this invention provides improved mechanical and electrical packaging efficiency and lower cost, compared with previously known configurations. The mechanical topology of the module is not only more compact, but permits the use of cost effective materials such as stamped electrical terminals. At the same time, the electrical topology results in a switching module having very low electrical inductance for improved high frequency switching performance. While this invention has been described in reference to the illustrated embodiment, it is expected that various modifications will occur to those skilled in the art. In this regard, it will be understood that the scope of this invention is not limited to the illustrated embodiment, and that switching modules incorporating such modifications may fall within the scope of this invention, which is defined by the appended claims.

The embodiments of the invention in which an exclusive property or privilege is claimed are defined as follows:

1. A parallel dual semiconductor switch module, comprising a baseplate;

a molded insulative housing mounted on a marginal area of said baseplate, and having first and second opposing walls which support a first elongate metal plate extending along a longitudinal axis of said module, said first metal plate having a first end extending though said first housing wall to form a common terminal of said module, said first metal plate having multiple spaced apart and raised lateral connection areas formed along each lateral edge thereof;

second and third elongate metal plates disposed side-by-side atop said first elongate metal plate, but insulated therefrom, said second and third metal plates having terminal portions which extend perpendicular to said first plate through a top of said housing to form positive and negative terminals of said module, respectively, and having connection area portions which extend in opposite lateral directions relative to said first plate and which interdigitate with respective lateral connection areas of said first metal plate; and first and second sets of semiconductor switch assemblies disposed on said baseplate on opposite lateral sides of said first metal plate adjacent said interdigitated connection areas, each semiconductor switch assembly having a first terminal bonded to an adjacent connection area of said first metal plate, and a second terminal bonded to an adjacent connection area of the respective second or third metal plate.

2. The switch module of claim 1, wherein the first metal plate is insert molded in the housing, and a second end of said first metal plate opposite said first end is loosely supported by said second housing wall, so as to permit relative movement between said metal plate and said housing during thermal cycling of said module.

3. The switch module of claim 1, wherein said first and second terminals of said switch assemblies have a generally Z-shaped configuration which permits close spacing of said switch assemblies to said plates and which provides stress relief to accommodate relative movement of said switch assemblies and said plates.

4. The switch module of claim 1, wherein heat generated by said switch assemblies is transferred out of said module through said baseplate and into an underlying support structure to which said baseplate is fastened, and a surface of said baseplate facing said underlying support structure is recessed in a region opposite said metal plates to promote heat transfer from said switch assemblies to said underlying support structure.

5. The switch module of claim 1, wherein said baseplate and module each include openings that are axially aligned and adapted to receive fasteners for fastening said module to an underlying support structure, and wherein said module includes a bushing received in each opening of said housing, each bushing having a first end including a flange adjacent a top surface of said housing and adapted to be engaged by a respective fastener, and a second end engaging said baseplate, whereby fastening force developed by said fasteners is applied through said bushings to said baseplate.

6. The switch module of claim 1, wherein said terminal portions are disposed in a central region of said first and second plates to provide substantially symmetrical inductance and resistance paths to individual semiconductor switch assemblies of said first and second sets of switch assemblies.

7. The switch module of claim 6, wherein said terminal portions include at least two openings for attachment of said terminal plates to an external circuit, said openings being spaced apart to encourage substantially even current distribution in said first and second terminal plates.

8. A parallel dual semiconductor switch module, comprising a baseplate;

a central gate collection component mounted in a central area of said baseplate, extending along a longitudinal axis of said module, and having wall sections which support first and second spaced apart elongate terminal strips, said terminal strips being electrically coupled to first and second gate terminals of said module;

a molded insulative housing mounted on a marginal area of said baseplate, and having first and second opposing walls which support a first elongate metal plate atop said gate collection module, said first metal plate having a first end extending though said first wall to form a common terminal of said module, said first metal plate having multiple spaced apart and raised lateral connection areas formed along each lateral edge thereof;

second and third elongate plates disposed side-by-side atop said first elongate metal plate, but insulated therefrom, said second and third plates having terminal portions which extend perpendicular to said first plate through a top of said housing to form positive and negative terminals of said module, respectively, and having connection area portions which extend in opposite lateral directions relative to said first plate and which interdigitate with respective lateral connection areas of said first metal plate; and first and second sets of semiconductor switch assemblies disposed on said baseplate on opposite lateral sides of said first plate adjacent said interdigitated connection areas, each semiconductor switch assembly having a first terminal bonded to an adjacent connection area of said first plate, a second terminal bonded to an adjacent connection area of the respective second or third plate, and a gate terminal bonded to a respective terminal strip of said central gate collection component.

9. The switch module of claim 8, wherein said gate terminals are bonded to the respective terminal strips of said central gate collection component by wire conductors routed between the first and second terminals of respective switch assemblies.

10. The switch module of claim 9, wherein the wire conductors bonding the gate terminals to the respective terminal strips of said central gate collection component are oriented substantially perpendicular to portions of the switch assembly terminals between which they are routed, thereby to minimize magnetic coupling between such wire conductors and such switch assembly terminals.

11. The switch module of claim 8, wherein the first metal plate is insert molded in the housing, and a second end of said first metal plate opposite said first end is loosely supported by said second housing wall, so as to permit relative movement between said metal plate and said housing during thermal cycling of said module.

12. The switch module of claim 8, wherein said first and second terminals of said switch assemblies have a generally Z-shaped configuration which permits close spacing of said switch assemblies to said plates and which provides stress relief to accommodate relative movement of said switch assemblies and said plates.

13. The switch module of claim 8, wherein heat generated by said switch assemblies is transferred out of said module through said baseplate and into an underlying structure to which said baseplate is fastened, and a surface of said baseplate facing said underlying structure is recessed in a region opposite said central gate collection component to promote heat transfer from said switch assemblies to said underlying structure.

14. The switch module of claim 8, wherein said baseplate and module each include openings that are axially aligned and adapted to receive fasteners for fastening said module to an underlying support structure, and wherein said module includes a bushing received in each opening of said housing, each bushing having a first end including a flange adjacent a top surface of said housing and adapted to be engaged by a respective fastener, and a second end engaging said baseplate, whereby fastening force developed by said fasteners is applied through said bushings to said baseplate.

* * * * *